United States Patent
Dip

(10) Patent No.: US 11,469,147 B2
(45) Date of Patent: Oct. 11, 2022

(54) GAS PHASE PRODUCTION OF RADICALS FOR DIELECTRICS

(71) Applicant: Tokyo Electron Limited, Tokyo (JP)

(72) Inventor: Anthony Dip, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 191 days.

(21) Appl. No.: 16/984,618

(22) Filed: Aug. 4, 2020

(65) Prior Publication Data
US 2022/0044974 A1    Feb. 10, 2022

(51) Int. Cl.
| | | |
|---|---|---|
| H01L 21/66 | (2006.01) | |
| H01L 21/02 | (2006.01) | |
| C23C 16/50 | (2006.01) | |
| C23C 16/30 | (2006.01) | |
| C23C 16/458 | (2006.01) | |
| C23C 16/455 | (2006.01) | |

(52) U.S. Cl.
CPC ............ H01L 22/20 (2013.01); C23C 16/308 (2013.01); C23C 16/4584 (2013.01); C23C 16/45565 (2013.01); C23C 16/50 (2013.01); H01L 21/0214 (2013.01); H01L 21/0228 (2013.01); H01L 21/02181 (2013.01); H01L 21/02274 (2013.01)

(58) Field of Classification Search
None
See application file for complete search history.

(56) References Cited

U.S. PATENT DOCUMENTS

| | | | |
|---|---|---|---|
| 8,119,210 B2 | 2/2012 | Narwankar et al. | |
| 2011/0033638 A1* | 2/2011 | Ponnekanti | C23C 16/52 |
| | | | 118/723 E |
| 2013/0306758 A1* | 11/2013 | Park | B05B 1/185 |
| | | | 239/418 |
| 2014/0000686 A1* | 1/2014 | Mungekar | H01L 31/02167 |
| | | | 438/98 |
| 2017/0053792 A1 | 2/2017 | Lu et al. | |

OTHER PUBLICATIONS

Jhansirani, K., et al. "Deposition of Silicon Nitride Films Using Chemical Vapor Deposition for Photovoltaic Applications." Results in Physics, vol. 6, 2016, pp. 1059-1063., doi:10.1016/j.rinp.2016.11.029.

Meng, Xin, et al. "Atomic Layer Deposition of Silicon Nitride Thin Films: A Review of Recent Progress, Challenges, and Outlooks." Materials, vol. 9, No. 12, 2016, p. 1007., doi:10.3390/ma9121007.

Ahchawarattaworn, Jutharat, School of Chemical Engineering and Advanced Materials, Newcastle University UK, "Perovskite Oxynitride Dielectrics," Jan. 2011, 246 pages.

(Continued)

*Primary Examiner* — Asok K Sarkar
(74) *Attorney, Agent, or Firm* — Slater Matsil, LLP

(57) ABSTRACT

A method for depositing a dielectric material includes heating a substrate disposed in a dielectric deposition chamber; dispensing a dielectric precursor from a first showerhead towards a major outer surface of the substrate; dispensing a mixture containing oxygen and ammonia from a second showerhead towards the major outer surface of the substrate; and reacting the dielectric precursor with the mixture to deposit a layer of oxynitride dielectric material on the substrate.

22 Claims, 9 Drawing Sheets

(56) References Cited

OTHER PUBLICATIONS

Coppens, F.H.V., et al., "The Effects of Composition on the Burning Velocity and Nitric Oxide Formation in Laminar Premixed Flames of CH4 + H2 + O2 + N2," Combustion and Flame 149, Feb. 22, 2007, 9 pages.

Musin, R.N., et al., "Novel Bimolecular Reactions between NH3 and HNO3 in the Gas Phase," J. Phys. Chem. vol. 102, No. A, 1998, 102, 7 pages.

Zabetta, Coda E., et al., "Kinetic Modeling Study on the Potential of Staged Combustion in Gas Turbines for the Reduction of Nitrogen Oxide Emissions from Biomass IGCC Plants," Energy & Fuels, vol. 14, No. 4, Jun. 2000, 11 pages.

Philip, Anu, "Preparation and Characterization of High-k Aluminum Oxide Thin Films by Atomic Layer Deposition for Gate Dielecliic Applications,", Chapter 1 entitled "High-K Dielectrics for Gate Oxide Applications," Dec. 2011, 19 pages.

\* cited by examiner

GAS PHASE PRODUCTION OF RADICALS FOR DIELECTRICS

TECHNICAL FIELD

The present invention relates generally to a system and method for dielectric deposition, and, in particular embodiments, to gas phase production of radicals for dielectrics.

BACKGROUND

One way of depositing dielectric thin films is chemical vapor deposition (CVD). For depositing oxynitride dielectric films, using a CVD process, gas containing silicon precursor molecules is released into a dielectric deposition chamber where they react to form silicon molecules. In addition to the gas containing the silicon precursor molecules, a second gas containing a mixture of $N_2O$ and ammonia is introduced. These react to form a silicon oxynitride dielectric film on the substrate. The silicon precursor molecules can either react thermally or react with plasma assistance. In another dielectric deposition method called atomic layer deposition (ALD), the heated substrate is exposed to a first precursor molecule (silicon precursor) which decomposes and deposits a layer of dielectric atoms. The first precursor vapor is then removed and the heated substrate is exposed to second precursor molecules (mixture of $N_2O$ and ammonia) which decompose and react with the layer of dielectric atoms forming silicon oxynitride dielectric molecules. These ALD cycles are repeated to deposit the silicon oxynitride dielectric molecules layer by layer until the desired thickness of silicon oxynitride dielectric film is deposited.

It is well known that the stoichiometry of oxygen and nitrogen in the silicon oxynitride dielectric film has a direct relationship with the dielectric constant of the film. Any variation (wafer to wafer, across die) in the stoichiometry of oxygen and nitrogen causes a change in the dielectric constant and therefore on device characteristics. In addition, inclusion of voids, and/or unwanted elements such as halogens and carbon can additionally cause the formation of poorer quality dielectrics by e.g., introducing charge states with levels located within the silicon bandgap. Therefore, one of the challenges of fabricating thin silicon oxynitride dielectric films is the ability to finely control the ratio of oxygen to nitrogen in the film while still producing a good quality film.

SUMMARY

A method for depositing a dielectric material includes heating a substrate disposed in a dielectric deposition chamber; dispensing a dielectric precursor from a first showerhead towards a major outer surface of the substrate; dispensing a mixture containing oxygen and ammonia from a second showerhead towards the major outer surface of the substrate; and reacting the dielectric precursor with the mixture to deposit a layer of oxynitride dielectric material on the substrate.

BRIEF DESCRIPTION OF THE DRAWINGS

For a more complete understanding of the present invention, and the advantages thereof, reference is now made to the following descriptions taken in conjunction with the accompanying drawings, in which:

FIGS. 2-3 illustrate cross-sectional views of a schematic atomic layer deposition (ALD) process for depositing an oxynitride film in accordance with embodiments of the present invention, wherein FIG. 2 illustrates a first subprocess and FIG. 3 illustrates a second subprocess;

DETAILED DESCRIPTION OF ILLUSTRATIVE EMBODIMENTS

Embodiments of the present disclosure provide a novel chemistry that includes generating oxygen and amino radicals in a gas phase, which enables improved control of the amount of oxygen and nitrogen incorporated into oxynitride dielectric films. Embodiments of the present application may be used in various deposition processes such as chemical vapor deposition (CVD), atomic layer deposition (ALD), or other techniques.

Although the various embodiments are discussed using silicon oxynitride as an example, embodiments of the present application apply to the formation of other oxynitride dielectric material including oxygen and nitrogen.

As discussed in more details in various embodiments, the present application discloses dispensing a gas mixture containing oxygen and ammonia, which then react to form amino radicals ($NH_2$*) and oxygen radicals (O*). These radicals react with dielectric atoms from a dielectric precursor to form a silicon oxynitride film in accordance with embodiments of the invention.

Figure 1:
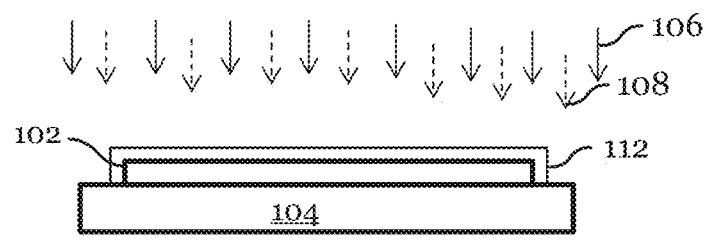
FIG. 1 illustrates a cross-sectional view of a schematic chemical vapor deposition (CVD) process for depositing an oxynitride film in accordance with embodiments of the present invention.

FIG. 1 illustrates a cross-sectional view of a schematic chemical vapor deposition (CVD) process for depositing an oxynitride film in accordance with embodiments of the present invention.

In various embodiments, as illustrated in FIG. 1, oxynitride thin films are deposited in a chemical vapor deposition (CVD) process by reacting amino radicals (NH$_2$*) and oxygen radicals (O*) with dielectric atoms to form a layer of oxynitride dielectric 112 molecules. In FIG. 1, a dielectric precursor gas 106 and a mixture gas 108 containing NH$_2$* and O* radicals are directed towards a heated substrate 102 that is supported on a heated substrate holder 104. The dielectric precursor gas 106 decomposes to release dielectric atoms which then combine with the highly reactive NH$_2$* and O* radicals to form oxynitride dielectric molecules which deposit on the heated substrate 102.

In various embodiments, the high reactivity of the NH2* radicals and the O* radicals improves the quality of the deposited oxynitride dielectric film. Dielectric precursor gas 106 generally contains halogen atoms such as chlorine or carbon containing organic groups such as methyl or ethyl groups. The highly reactive NH2* and O* radicals aggressively react with halogen and carbon from the precursors. In contrast, in the absence of these radicals halogen and/or carbon atoms could get trapped in the growing oxynitride dielectric, and may de-gas during subsequent processing leaving behind a poor dielectric lattice. On the other hand, using the embodiments of the invention, the purity and quality of the oxynitride films may be improved as determined by such measurements as wet etching rate, dielectric leakage, and dielectric breakdown uniformity. As known to a person skilled in the art, other techniques to determine quality include measurements of as index of refraction, dielectric constant, dielectric leakage current, breakdown voltage, and pin hole density. Similarly, other techniques to determine purity include Fourier-transform infrared spectroscopy (FTIR), mass spectroscopy, x-ray diffraction, and energy dispersive x-ray spectroscopy (EDS). The oxynitride dielectric CVD process in some examples can be a thermal reaction and in other examples can be performed at lower temperatures using a plasma enhanced CVD (PECVD) process.

Figure 2:
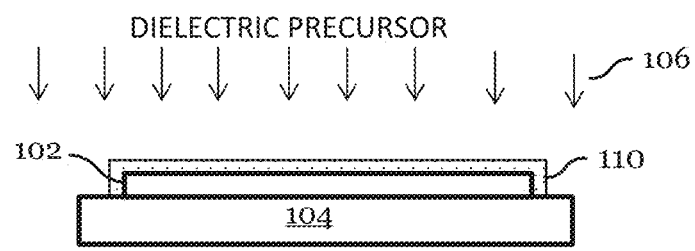
Figure 3:
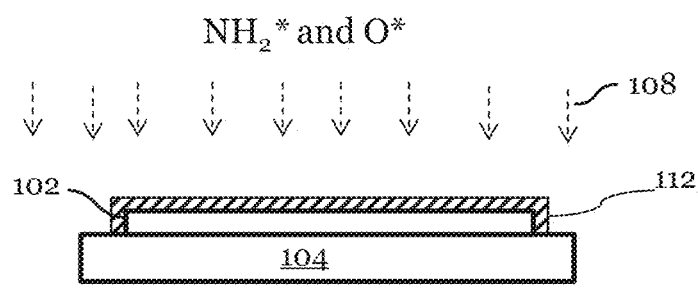

FIGS. 2-3 illustrate cross-sectional views of a schematic atomic layer deposition (ALD) process for depositing an oxynitride film in accordance with embodiments of the present invention, wherein FIG. 2 illustrates a first subprocess and FIG. 3 illustrates a second subprocess.

As is known to a person skilled in the art, atomic layer deposition involves cyclic deposition of a plurality of atomic layers in a cyclic process. Each atomic layer is deposited using two sequential subprocesses. Accordingly, FIG. 2 illustrates a schematic cross-sectional view of a substrate after a first subprocess and FIG. 3 illustrates a schematic cross-sectional view of the substrate after a second subprocess that completes the formation of a single atomic layer.

In FIG. 2, a dielectric precursor gas 106 is dispensed towards a heated substrate 102 supported on a heated substrate holder 104. The dielectric precursor gas 106 decomposes depositing a monolayer of dielectric atoms 110 on the substrate 102. However, the dielectric atoms 110 have exposed dangling bonds that can react further.

The dielectric precursor gas 106 flow is then turned off and a gas mixture containing NH2* and O* radicals is dispensed toward the heated substrate 102 that is coated with the Di atoms. The NH2* and O* radicals react with the dangling bonds of the layer of dielectric atoms 110 to form a layer of oxynitride dielectric 112 molecules. This layer of oxynitride dielectric molecules forms an atomic monolayer of dielectric material.

The mixture gas 108 is then turned off and additional cycles of depositing an atomic monolayer of dielectric atoms 110 followed by reaction with NH2* and O* radicles are repeated until the target thickness of oxynitride dielectric 112 molecules is achieved.

The gas mixture and subsequent reactions used in the above embodiments described using FIGS. 1-3 may be achieved with one or more chemistries as described further below.

In various embodiments, amino (NH$_2$*) radicals can be formed by the reaction of oxygen (O*) radicals with ammonia (NH$_3$). Oxygen (O*) radicals extract hydrogen atoms (H*) from ammonia (NH$_3$) forming amino radicals (NH$_2$*) plus other compounds such as hydroxyl radicals (OH*), water (H$_2$O), and hydrazine (N$_2$H$_4$).

$$NH_3 + O^* => NH_2^* + OH^* + H_2O + N_2H_4 \quad (1)$$
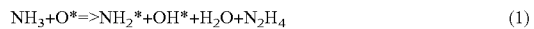

In one or more embodiments, oxygen radicals (O*) may be formed by reacting oxygen with hydrogen introduced within the mixture gas 108 or in an alternative embodiment directly from ozone as described in further details below.

In certain embodiments, oxygen radicals (O*) can be formed by the thermal reaction of hydrogen (H$_2$) with oxygen (O2) at temperatures above about 550° C. H$_2$ and O$_2$ react to form oxygen radicals (O*), hydroxyl radicals (OH*), and water (H$_2$O).

$$O_2 + H_2 => O^* + OH^* + H_2O \quad (2)$$

A mixture containing NH2* and O* radicals can be formed by heating a mixture of O$_2$, H$_2$, and NH$_3$ above about 600° C.

$$NH_3 + O_2 + H_2 => NH_2^* + O^* + OH^* + H_2O + N_2H_4 \quad (3)$$
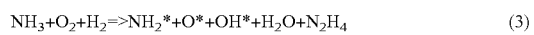

In various embodiments, the ratio of NH2* to O* radicals in the mixture can be adjusted between about 0 and about 25 by varying the ratio of oxygen to hydrogen and the mole fraction of ammonia in the mixture. The ratio of oxygen to hydrogen can be varied between about 0.5 and about 2.0 and the mole fraction of ammonia can be varied between about 20% to about 50%. In one embodiment, a ratio of oxygen to hydrogen is about 1.5 and a mole fraction of ammonia is about 30% in the mixture. Increasing the NH2* radical concentration in the mixture increases the stoichiometry of nitrogen in the deposited oxynitride dielectric film.

Deposition temperature, deposition pressure, and gas flow rates are also factors in controlling the deposition rate, deposition uniformity, stoichiometry, and film properties of the oxynitride dielectric.

In an arrangement, the temperature of the substrate holder is held between about 600° C. and about 1100° C. and the chamber pressure is between about 1 Torr and about 10 Torr. In one embodiment, the substrate holder is held at about 800° C. In certain embodiments, the ratio of oxygen to hydrogen is between about 1.25 and about 1.75, the mole fraction of ammonia in the mixture is between about 10% and about 40% and the flow rate of the mixture is between about 5 and about 15 slm. The mole fraction of NH2* radicals in the mixture is between about 0.4% and about 0.1% depending upon the mole fraction of ammonia in the mixture gas.

In one arrangement the dielectric precursor is a chlorosilane and the oxynitride dielectric is silicon oxynitride (SiON). In another arrangement the dielectric precursor is hafnium chloride and the oxynitride dielectric is hafnium oxynitride (HfON).

Amino radicals (NH2*) plus oxygen (O*) radicals react with dielectric atoms (Di) to form oxynitride dielectric molecules (DiON) as provided in the following reaction.

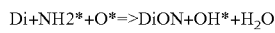

In various embodiments, different dielectric precursors are used to deposit different dielectric atoms (Di). For example, chlorosilane precursors can be used to deposit silicon nitride and silicon oxynitride, hafnium chloride can be used to deposit hafnium oxide and hafnium oxynitride, Tris(dimethylamido)aluminum can be used to deposit aluminum oxide and aluminum oxynitride (AlON) and zirconium chloride or iodide can be used to deposit zirconium oxide or zirconium oxynitride.

In an alternative embodiment, $NH_2^*$ and O* radicals can be formed by mixing ozone with ammonia together and then thermally decomposing the ozone to form O* which then reacts with the ammonia to form $NH_2^*$ radicals.

In yet another alternative embodiment, $NH_2^*$ and O* radicals can be formed by mixing O* radicals generated at a remote plasma source with ammonia. In this embodiment, a separate remote plasma may generate the oxygen (O*) radicals, which are then transported to the deposition chamber and mixed with the ammonia.

The inventor of this application further note that typically the reactions between oxygen, hydrogen and ammonia have the risk of producing volatile byproducts which may condense on unheated surfaces. These byproducts include ammonium nitrite which if mishandled, which can then result in an explosive reaction. Therefore, such mixtures are not contemplated to be used in semiconductor manufacturing. However, the inventor has simulated the reactions in an advanced simulator and found that when the proper process window as described above is used, the likelihood of causing an explosion is eliminated making this a viable manufacturing process. This is because the hydrogen and ammonia are consumed by the oxygen (reaction equations (2) and (3)), which reduces the amount of ammonia available to form into volatile compounds. Further, the temperatures and pressure in the process chamber and connected vacuum lines are unfavorable to the formation of nitric acid which is required to form ammonium nitrite compounds. Further, heating of the pump exhaust will prevent any such formation of the exhausted effluent until it can be processed by standard wet scrubbing or thermal destruct methods.

Figure 4:
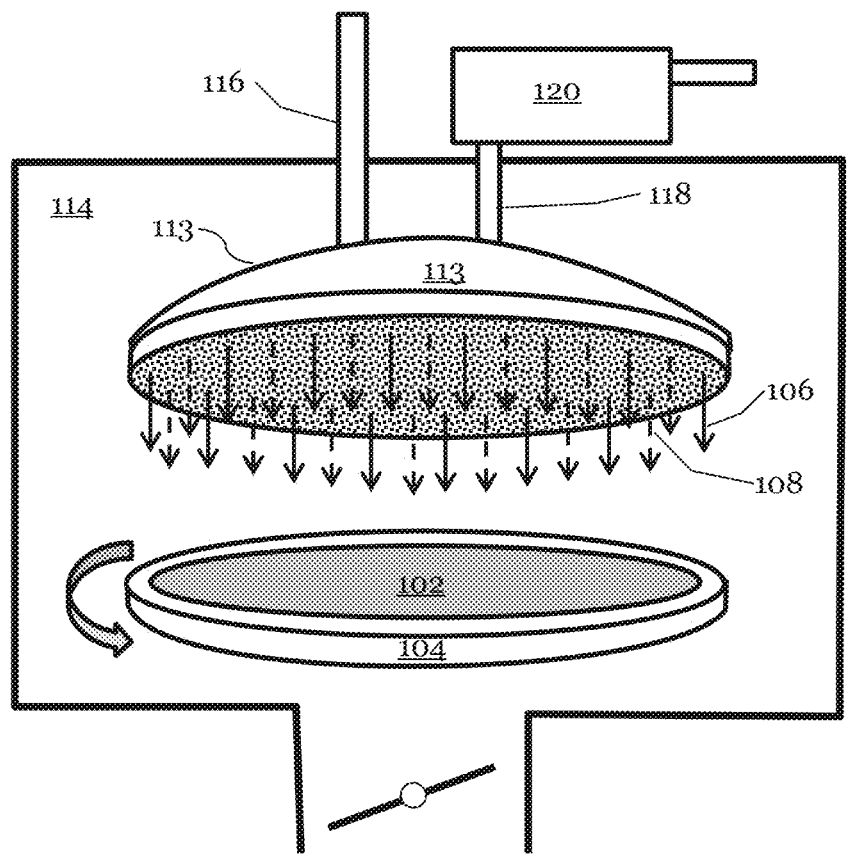
FIG. 4 illustrates a cross-sectional view of a deposition tool comprising a dual showerhead design for depositing an oxynitride dielectric film in accordance with embodiments of the present invention.

FIG. 4 illustrates a cross-sectional view of a deposition tool comprising a dual showerhead design for depositing an oxynitride dielectric in accordance with embodiments of the present invention.

In one or more embodiments, the deposition tool 114 as illustrated in FIG. 4 may be a single wafer oxynitride dielectric CVD tool. In certain embodiments, the deposition tool 114 may be a plasma tool. The dielectric precursor gas 106 and the mixture gas 108 comprising oxygen, ammonia along with either hydrogen or ozone are dispensed from a dual showerhead 113 towards a heated substrate 102 supported on a heated substrate holder 104. The substrate holder 104 is heated to a temperature greater than about 550° C.

Figure 5:
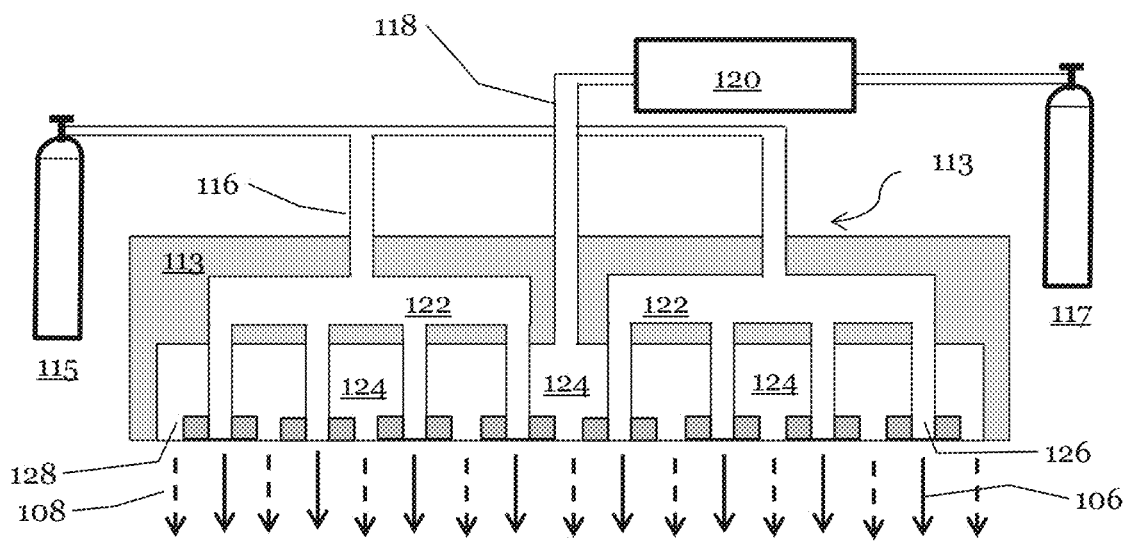
FIG. 5 illustrates a cross section of the dual showerhead of FIG. 4 in accordance with embodiments of the present invention.

FIG. 5 illustrates a cross section of the dual showerhead 113 of FIG. 4 in accordance with embodiments of the present invention.

Referring to also FIG. 5, the dielectric precursor is introduced into a first cavity 122 in the dual showerhead 113 through a first gas line 116. The mixture gas 108 is introduced into a second cavity 124 in the dual showerhead 113 through a second gas line 118. The dielectric precursor gas 106 is kept separate from the mixture gas 108 to prevent the formation and deposition of molecules of oxynitride dielectric 112 within the dual showerhead 113. Accordingly, in various embodiments, reaction between the oxygen, hydrogen, and ammonia in the mixture (or ozone and ammonia) does not occur until the temperature of the mixture gas 108 is raised by the heated substrate 102. The O* and NH2* radicals are formed near or on the surface of the heated substrate 102. Likewise the dielectric precursor gas 106 does not decompose to deposit dielectric atoms 110 until the dielectric precursor gas 106 gets near or contacts the surface of the heated substrate 102. Near or on the surface of the heated substrate 102, NH2* and O* radicals react with dielectric atoms 110 to form molecules of oxynitride dielectric 112, which deposit on the substrate 102.

In some arrangements, the mixture gas 108 is preheated to a temperature between about 250° C. and 350° C. prior to introducing it into the dual showerhead 113.

Referring back to FIG. 5, a first cavity 122 in the dual showerhead 113 is coupled to a first source 115 of dielectric precursor gas via first gas line 116. A second cavity 124 in the dual showerhead is coupled to a second source 117 of the mixture gas 108 via second gas line 118.

Further, a gas preheater 120 in the second gas line 118 can be used to preheat the mixture gas 108 before it enters the dual showerhead 113. The dielectric precursor gas 106 is dispensed from the first cavity 122 in the direction of the heated substrate 102 through a first set of gas exit holes 126 located at the bottom of the showerhead 11. The mixture gas 108 is dispensed from the second cavity 124 in the direction of the heated substrate 102 through a second set of gas exit holes 128 located at the bottom of the showerhead 11.

As known to a person having ordinary skill in the art, additional flow controllers, valves, pumps, and others may be included in the fluid distribution path and are not illustrated here.

Figure 6:
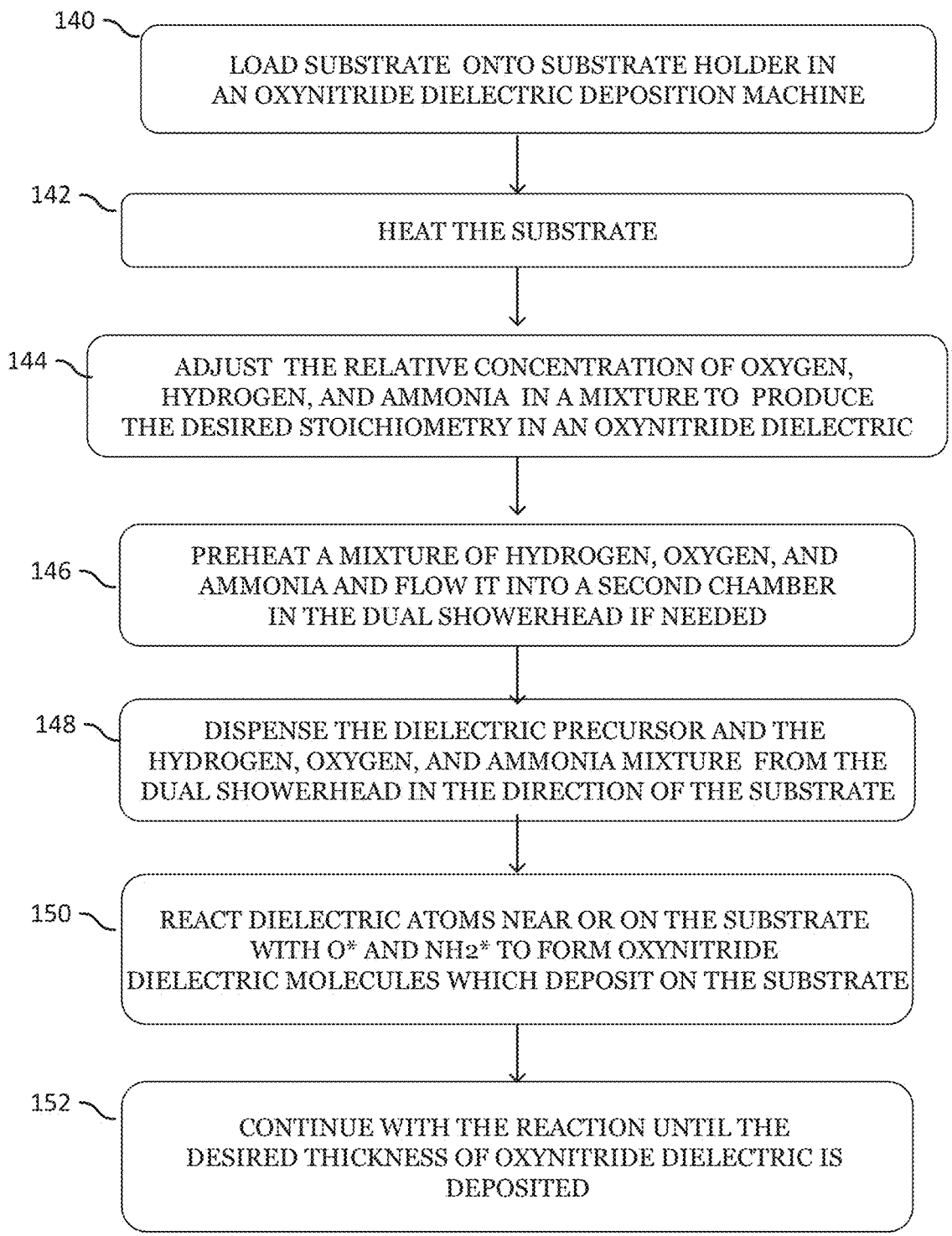
FIG. 6 is a flow diagram of a process of forming an oxynitride dielectric film with the deposition tool of FIGS. 4-5 in accordance with an embodiment.

FIG. 6 is a flow diagram of a process of forming an oxynitride dielectric film with the deposition tool of FIGS. 4-5 in accordance with an embodiment.

In the first method block 140, a substrate 102 is loaded onto the substrate holder 104 inside a process chamber of the deposition tool 114.

In various embodiments, the substrate 102 being fabricated may be a semiconductor wafer undergoing a unit process step within a fabrication facility in which the deposition tool 114 is located. The substrate 102 may have already undergone a number of fabrication steps as known to a person having ordinary skill in the art. For example, the substrate 102 may include all or portion of active devices being formed in the substrate 102.

As explained in more detail here, while going through the steps of FIG. 6, the substrate 102 will undergo an oxynitride dielectric deposition process in which a layer of oxynitride will be formed. The layer of oxynitride may be a gate dielectric, an inter-level dielectric layer including etch stop liners, or other layers including trench liners, through via liners, and others.

A person having ordinary skill in the art will be familiar with the process of loading the substrate 102 from a prior processing step minimizing oxidizing any exposed material or introducing particles and other defects. In addition, in various embodiments, a cleaning process may be performed either before loading the substrate 102 into the deposition tool 114 or after loading the substrate 102. These additional processes are not described in detail as would be known to a person having ordinary skill in the art.

Next, in the second method block 142, the substrate 102 is heated to a temperature sufficiently high to decompose the dielectric precursor gas 106 molecules and to react the mixture gas 108 (comprising either a mixture of hydrogen, oxygen, and ammonia or comprising ozone and ammonia) to produce $NH_2^*$ and $O^*$ radicals.

As described in the third method block 144, an embodiment of the method includes adjusting the ratio of oxygen to hydrogen and the mole fraction of ammonia in the mixture gas 108 to produce the desired stoichiometry in the film of oxynitride dielectric 112 being deposited. For example, embodiments of the invention contemplate that after running a batch of wafers, various measurements may be performed that measures a metric of the dielectric film being deposited. Such measurements may include inline optical measurements such as scatterometry, scanning electron microscopy, or other techniques including electrical measurements. Based on the measurements, the ratio of oxygen to hydrogen and mole fraction of the ammonia in the mixture gas 108 may be adjusted for subsequent wafers or lots of wafers.

Embodiments of the method further include optionally preheating the mixture gas 108 prior to flowing it into the dual showerhead 113 (fourth method block 146). This step can be omitted in some arrangements.

Embodiments of the method further include, in a fifth method block 148, dispensing the dielectric precursor gas 106 through a first set of gas exit holes 126 from the dual showerhead 113 in the direction of the heated substrate 102 and to dispense the mixture gas 108 through a second set of gas exit holes 128 in the direction of the heated substrate 102.

Embodiments of the method further include, in a sixth method block 150, reacting NH2* and O* radicals produced by the reaction of the mixture gas 108 with dielectric atoms 110. In certain embodiments, the NH2* and O* radicals may be produced near the heated substrate 102 while the dielectric atoms 110 may be produced on or near the heated substrate 102. As also previously discussed, in various embodiments, the dielectric atoms 11o are produced by the decomposition of the dielectric precursor gas 106 to form molecules of oxynitride dielectric 112 which deposit on the heated substrate 102.

As next illustrated in the seventh method block 152, the method repeats the fifth 148 and sixth 150 method blocks until the desired thickness of oxynitride dielectric 112 is deposited on the heated substrate 102.

Figure 7:
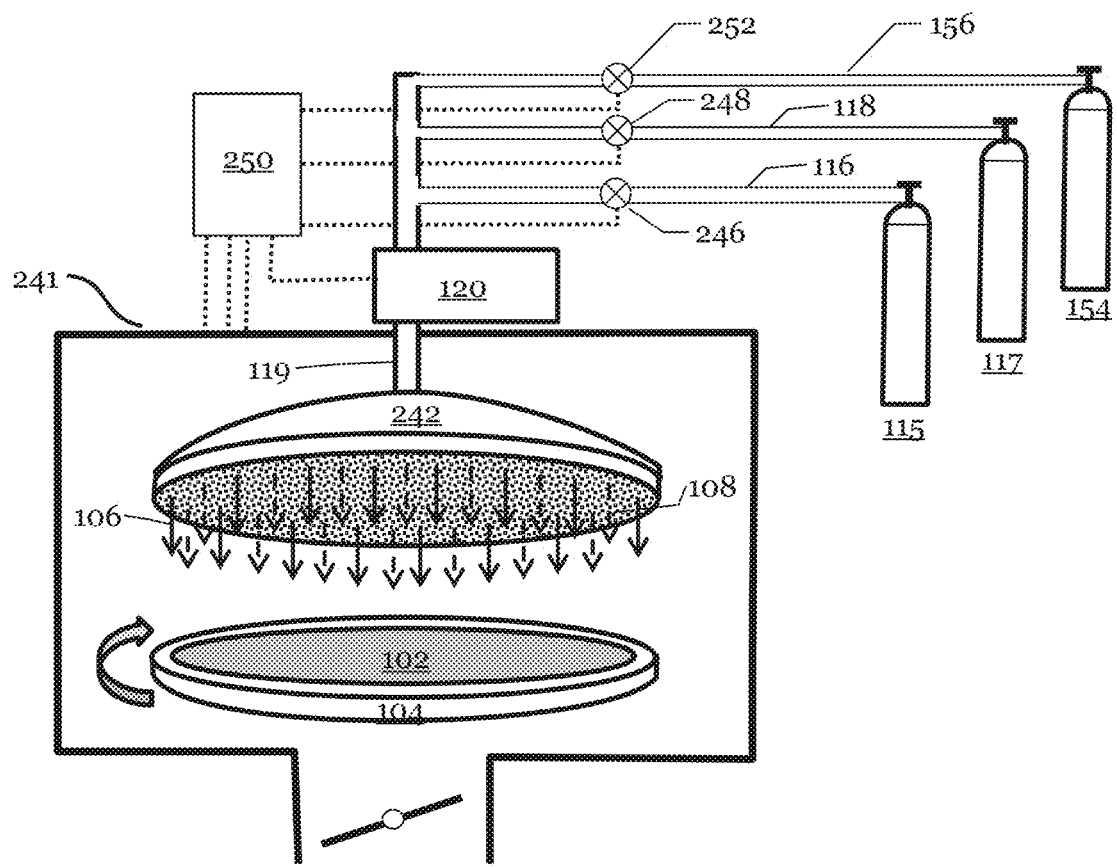
FIG. 7 illustrates a deposition tool with a showerhead for depositing an oxynitride dielectric film in accordance with an alternative embodiment.
Figure 8:
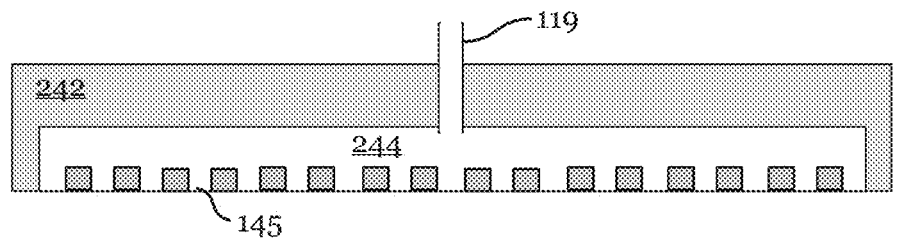
FIG. 8 is a cross section of an embodiment showerhead of the deposition tool of FIG. 7.
Figure 9:
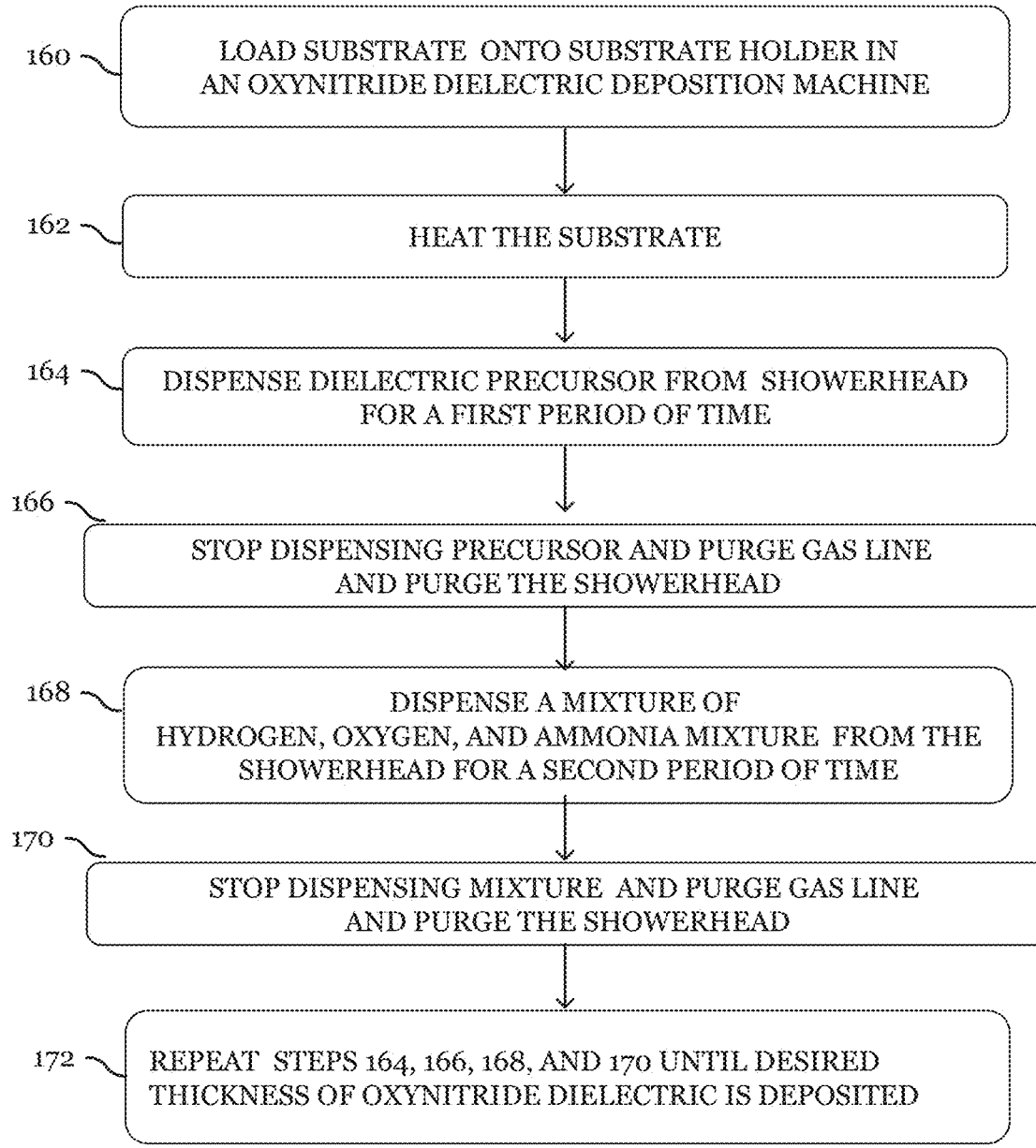
FIG. 9 is a flow diagram of a process of forming an oxynitride dielectric film with the deposition tool of FIGS. 7-8 in accordance with an embodiment.

FIG. 7 illustrates an alternative embodiment of a deposition tool with a showerhead for depositing oxynitride dielectric in accordance with an alternative embodiment, where FIG. 8 is a cross section of an embodiment showerhead of the deposition tool of FIG. 7, and where FIG. 9 is a flow diagram of a process of forming an oxynitride dielectric film with the deposition tool of FIGS. 7-8 in accordance with an embodiment.

The deposition tool of FIGS. 7-8 may be an atomic layer deposition (ALD) tool 241 in one or more embodiments. Unlike the prior embodiment, this embodiment uses a single showerhead design, where all the different gases are dispensed from, to form the oxynitride dielectric layer.

Referring to FIGS. 7-8, a showerhead 242 in an ALD tool 241 has a single cavity 244 and one set of gas exit holes 145 that dispense the dielectric precursor gas 106 and mixture gas 108 in the direction of the heated substrate 102. The gas line 119 through which the gasses flow into the showerhead 242 is connected to a first gas line 116 that is coupled to a first source 115 of the dielectric precursor gas 106, a second gas line 118 coupled to a second source 117 of the mixture gas 108 either comprising hydrogen, oxygen, and ammonia or comprising ozone and ammonia, and a third gas line 156 coupled to a third source 154 of an inert gas such as nitrogen, helium or argon.

A controller 250 can be coupled to dielectric precursor valve 246, the mixture gas valve 248, and the inert gas valve 252 in each of the first gas line 116, second gas line 118, and third gas line 156 to turn the flow of the respective gases off and on and to regulate the flows. The controller 250 can also be coupled to temperature sensors and heaters of the gas preheater 120 to adjust the temperature. The controller 250 can also be coupled to various sensors and devices in the ALD tool 241 to regulate temperature within the chamber, regulate temperature of the heated substrate 102, regulate pressure within the chamber, and regulate the speed of rotation of the substrate, among other things.

An atomic layer deposition process using the ALD tool 241 will now be described with reference to FIG. 9. Referring to the first method block 160 in FIG. 9, a substrate 102 is loaded onto the substrate holder 104 inside a process chamber of the ALD tool 241.

A person having ordinary skill in the art will be familiar with the process of loading the substrate 102 from a prior processing step minimizing oxidizing any exposed material or introducing particles and other defects. In addition, in various embodiments, a cleaning process may be performed either before loading the substrate 102 into the ALD tool 241 or after loading the substrate 102. These additional processes are not described in detail as would be known to a person having ordinary skill in the art.

As previously described, the substrate 102 may be have undergone various fabrication steps as known to a person having ordinary skill in the art. Even more than a CVD process, the surface cleanliness is critical for an atomic layer deposition process. Therefore, one or more preprocessing steps such as cleaning steps may be performed to remove any native oxide, particulate matter, or others. In one or more embodiments, some part of the preprocessing may be performed after the substrate 102 is loaded onto the ALD tool 241 but prior to any other processing.

As next illustrated in the second method block 162, the substrate 102 is heated to a temperature sufficiently high to decompose the dielectric precursor molecules and to react the mixture gas 108 comprising hydrogen, oxygen, and ammonia producing $NH_2^*$ and O* radicals. Alternatively, in the case when the mixture gas 108 comprises ammonia and ozone, the substrate 102 is heated to a temperature sufficiently high to decompose ozone to form oxygen O* radicals. Embodiments may also include heating the dielectric precursor gas 106 and/or mixture gas 108 before introducing them into the showerhead as discussed above as well as heating the process chamber.

As next described with the third method block 164, the inert gas valve 252 and the mixture gas valve 248 are closed and the dielectric precursor valve 246 is opened. Dielectric precursor gas 106 fills the single cavity 244 (or chamber) and is dispensed from the showerhead 242 in the direction of the heated substrate 102 through gas exit holes 145 in the bottom of the showerhead 242. The dielectric precursor gas 106 decomposes near or on the surface of the heated substrate 102 depositing a monolayer of dielectric atoms 11o covering the exposed surface of the heated substrate 102. As known to a person having ordinary skill in the art, this is a self-limiting process and is not further described.

In the fourth method block 166, the dielectric precursor valve 246 is turned off halting deposition of the dielectric atoms and the inert gas valve 252 is turned on to purge the gas line 119 and the showerhead 242 of residual dielectric precursor gas 106.

Referring next to the fifth method block 168, the inert gas valve 252 is turned off and the mixture gas valve 248 is turned on. The mixture gas 108 fills the single cavity 244 and is dispensed from the showerhead 242 in the direction of the heated substrate 102 through gas exit holes 145 in the bottom of the showerhead 242.

The mixture gas 108 reacts near or on the heated surface of the substrate 102 to produce amino ($NH_2$*) and oxygen (O*) radicals. These amino and oxygen radicals react with the monolayer of dielectric atoms 110 to form a layer of oxynitride dielectric molecules on the surface of the heated substrate 102 so as to form a single atomic layer of the oxynitride dielectric.

In certain embodiments, the amino and oxygen radicals may also react with impurities such as chlorine and carbon that may be generated from the decomposing dielectric precursor gas 106 converting them to gaseous molecules which are then removed from the oxynitride dielectric 112 being deposited. Advantageously, this helps to form a high quality dielectric material.

As next described with the sixth method block 170, the mixture gas valve 248 is turned off, which stops the production of the $NH_2$* and O* radicals. The inert gas valve 252 is turned on to purge the gas line 119 and the showerhead 242 of any residual mixture gas 108. If residual dielectric precursor gas 106 reacts with mixture gas 108 in the showerhead, dielectric particles might clog the gas exit holes 145. Some of these dielectric particles might exit through the gas exit holes 145 and get incorporated in the oxynitride dielectric thin film causing defects and impacting process yield (i.e., number of defect free devices produced in a wafer).

As next illustrated in the seventh method block 172, the method includes repeating method block steps 164, 166, 168, and 170 until the desired thickness of oxynitride dielectric 112 is deposited on the heated substrate 102. Embodiments of the present invention contemplate a process control loop to achieve the desired thickness. For example, the progress of the deposition process may be monitored in certain embodiments, e.g., in-situ within the process chamber. Various metrology techniques may be used to monitor the film being deposited. The number of deposition cycles may be changed depending on the monitoring. Embodiments of the invention also contemplate adjusting the number of deposition cycles in subsequent wafers based on the metrology.

Figure 10:
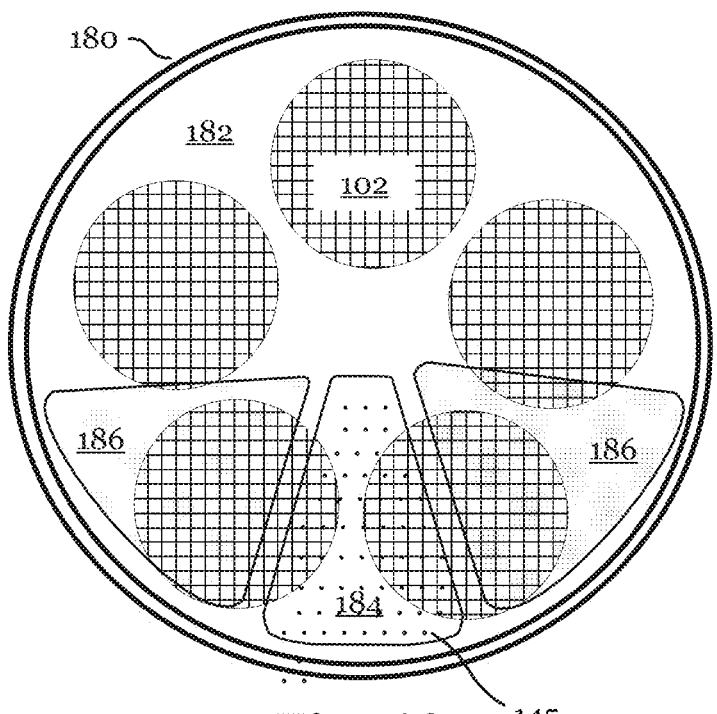
FIG. 10 illustrates a top view of a batch processing deposition tool for depositing an oxynitride dielectric film in accordance with an alternative embodiment.
Figure 11:
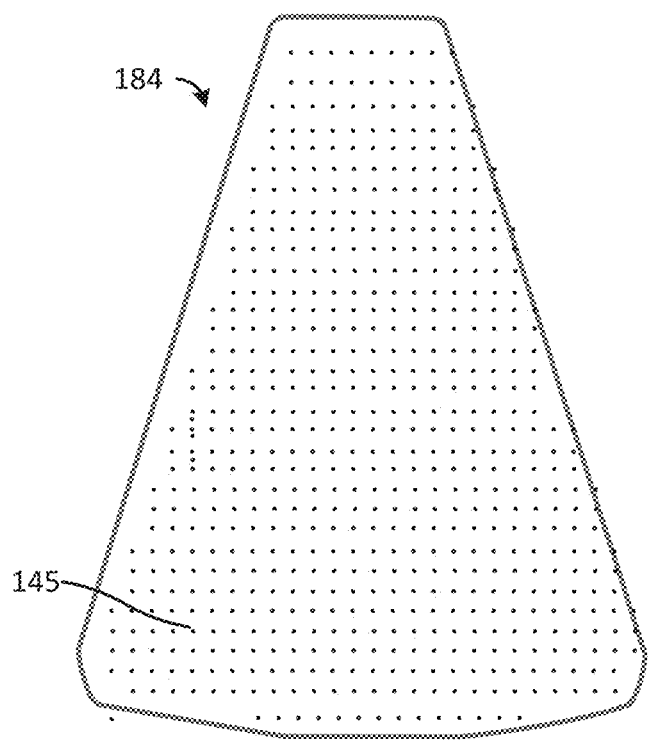
FIG. 11 is a top view of an embodiment wedge-shaped showerhead of the batch processing deposition tool of FIG. 10.

FIG. 10 illustrates a top view of a batch processing deposition tool for depositing an oxynitride dielectric film in accordance with an alternative embodiment, where FIG. 11 is a top view of an embodiment wedge-shaped showerhead of the batch processing deposition tool of FIG. 10.

As illustrated in FIG. 10, multiple substrates 102 such as semiconductor wafers can be loaded onto a substrate table 182, e.g., a circular table, within the deposition chamber. Reaction gases are dispensed through gas exit holes 145 toward the heated substrates 102 from a wedge-shaped dual showerhead 184. The wedge-shaped dual showerhead 184 lies between the center of the deposition chamber and the outer wall of the deposition chamber and lies over the heated substrate table 182. The substrate table 180 rotates around a central axis of the heated substrate table 182. Each time a heated substrate 102 passes under the wedge-shaped dual showerhead 184, a layer of oxynitride dielectric 112 is deposited. Multiple layers of oxynitride dielectric 112 are deposited until the desired thickness is achieved.

A first, wedge-shaped inert gas showerhead 186 adjacent to a first long side of the wedge-shaped dual showerhead 184 and a second, wedge-shaped inert gas showerhead 186 adjacent to the second long side of the wedge-shaped dual showerhead 184 help to contain the deposition of the oxynitride dielectric 112 to under the wedge-shaped dual showerhead 184. This decreases oxynitride dielectric 112 deposition and buildup elsewhere in the chamber which could result is delamination, particle formation, defects, and decreased process yield.

Except for being wedge-shaped instead of round, in one embodiment, the wedge-shaped dual showerhead 184 in the batch processing deposition tool 180 is similar to the dual showerhead 113 in the deposition tool 114 described using FIG. 5. Further, the method for depositing oxynitride dielectric 112 in the batch processing deposition tool 180 is similar to steps listed in FIG. 6 for depositing oxynitride dielectric 112 from the dual showerhead 113 in the deposition tool 114.

Figure 12:
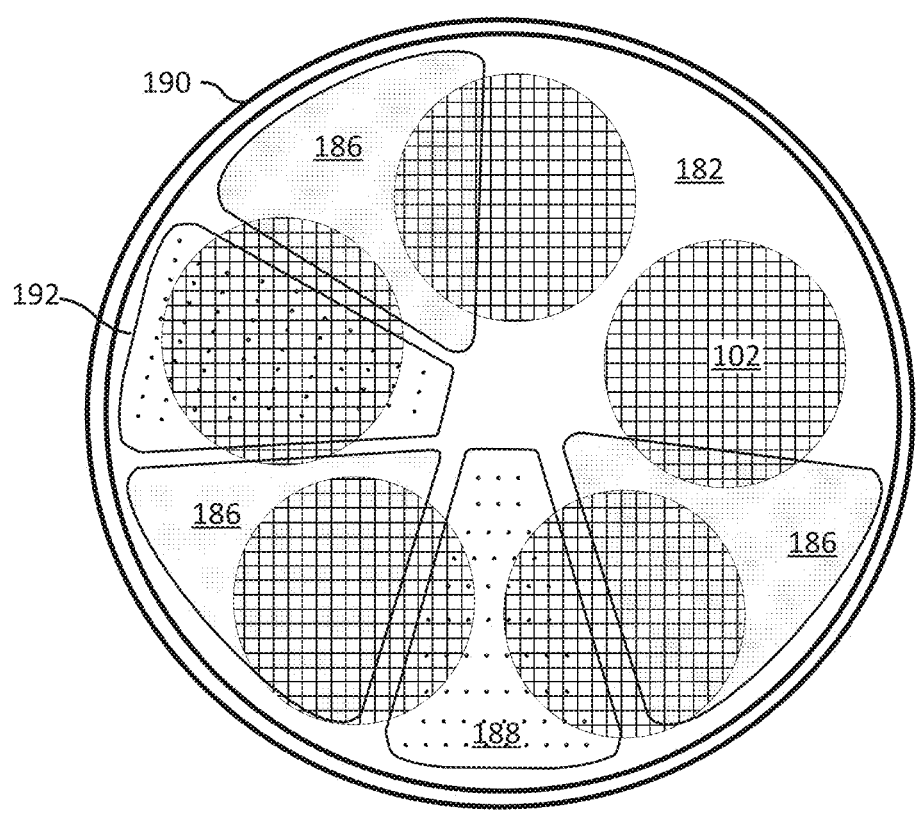
FIG. 12 illustrates a top view of a batch processing atomic layer deposition (ALD) tool for depositing an oxynitride dielectric film in accordance with an alternative embodiment.
Figure 13:
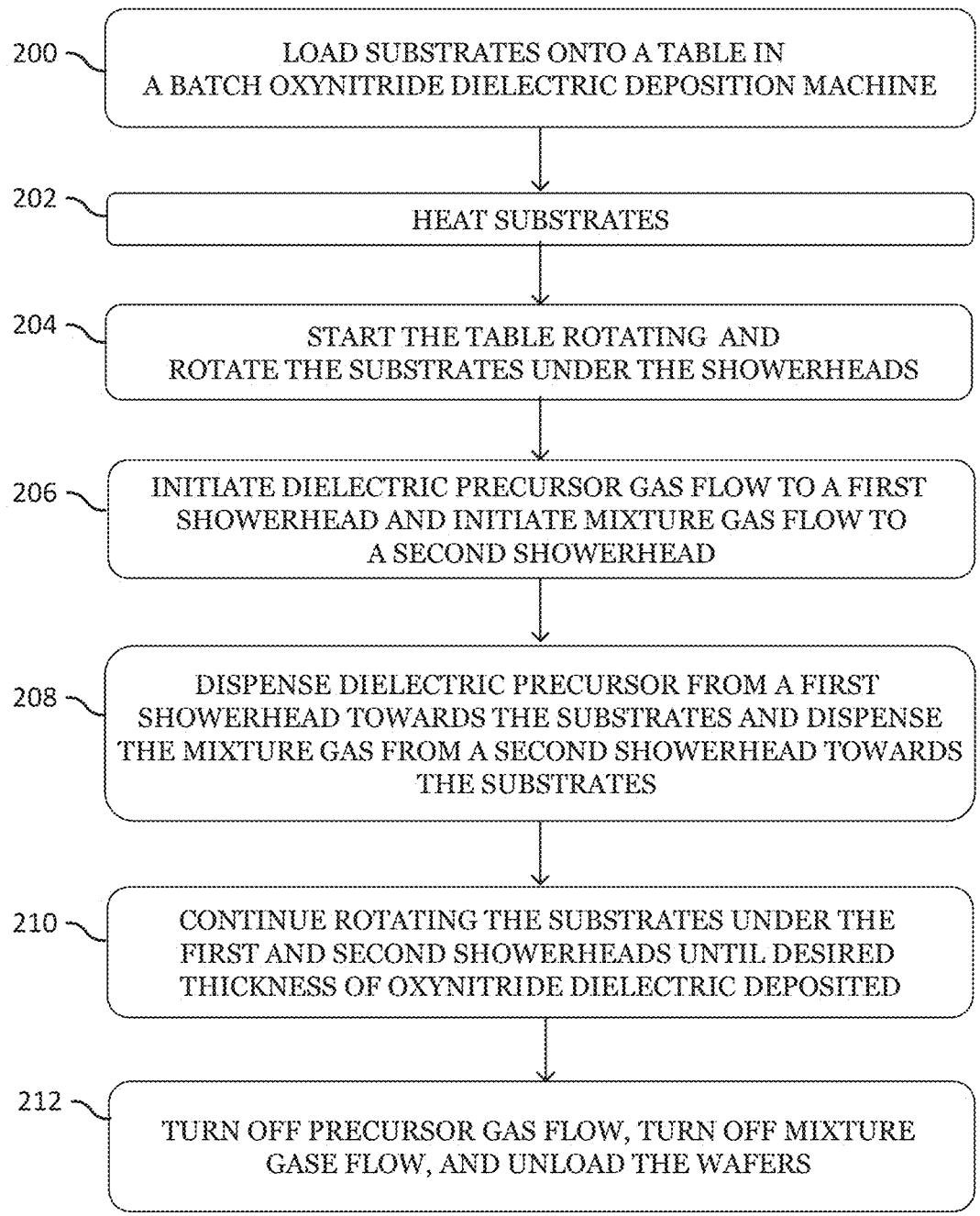
FIG. 13 is a flow diagram of a process of forming an oxynitride dielectric film with the deposition tool of FIG. 12 in accordance with an embodiment.

FIG. 12 illustrates a top view of a batch processing atomic layer deposition (ALD) tool for depositing an oxynitride dielectric film in accordance with an alternative embodiment, where FIG. 13 is a flow diagram of a process of forming an oxynitride dielectric film with the deposition tool of FIG. 12 in accordance with an embodiment.

Referring to FIG. 12, the processing chamber 190 comprises separate dielectric precursor gas showerhead 188 and mixture gas showerhead 192 that are used to dispense the dielectric precursor gas 106 and the mixture gas 108 (hydrogen, oxygen, and ammonia or ozone and ammonia).

Wedge-shaped inert gas showerheads 186 adjacent to the dielectric precursor gas showerhead 188 and the mixture gas showerhead 192 confine the depositions to below the respective dielectric precursor gas showerhead 188 and mixture gas showerhead 192. This reduces thin film buildup on the substrate table 182 and on the walls of the deposition chamber. In the processing chamber 190, during the deposition step, dielectric precursor gas 106 and mixture gas 108 flows are constantly turned on and flow uninterrupted while the substrate 102 rotates around a central axis of a substrate table 182.

Referring to FIG. 13, in a first method block 200 in FIG. 13, substrates 102 are loaded onto a substrate table 182 in the processing chamber 190.

In the second method block 202, the substrates 102 are heated to a temperature sufficiently high to decompose the molecules of the dielectric precursor gas 106 and to react the mixture gas 108 comprising hydrogen, oxygen, and ammonia or ozone and ammonia to produce $NH_2$* and O* radicals.

Referring next to the third method block 204, the heated substrate table 182 is rotated. The substrate 102 passes under the dielectric precursor gas showerhead 188 and under the mixture gas showerhead 192 during each cycle of the rotation.

As next illustrated in the fourth method block 206, the dielectric precursor gas 106 flow is started through dielectric precursor gas showerhead 188 and the mixture gas 108 flow is started through the mixture gas showerhead 192. Embodiments may also include heating the dielectric precursor gas 106 and/or the mixture gas 108 before introducing them into the showerhead as discussed above as well as heating the process chamber.

Next, dielectric precursor gas 106 is dispensed from the dielectric precursor gas showerhead 188 towards the heated substrates 102 and the mixture gas 108 is dispensed from the mixture gas showerhead 192 towards the heated substrates 102 (fifth method block 208). As the heated substrates 102 pass under the dielectric precursor gas showerhead 188, a monolayer of dielectric atoms 110 is deposited. Next, as the heated substrates 102 passes under the mixture gas showerhead 192, amino ($NH_2$*) and oxygen (O*) radicals react with the layer of dielectric atoms 110 to form molecules of oxynitride dielectric 112 so as to form a single atomic layer of oxynitride dielectric.

In the sixth method block 210 the substrate 102 continue to rotate under the wedge-shaped inert gas showerheads 186, the dielectric precursor gas showerhead 188, and the mixture gas showerhead 192 until a target thickness of oxynitride dielectric 112 is deposited. As known to a person skilled in the art, the target thickness of the oxynitride dielectric may be different based on the process flow and technology being used to manufacture the specific semiconductor device. However, for a given semiconductor device, this would be a fixed number with a limited process window. As previously described with respect to FIG. 9, various metrology techniques may be used to achieve the target thickness.

As next described in the seventh method block 212, the dielectric precursor gas 106 flow is turned off, the mixture gas 108 flow is turned off. The heated substrates 102 are removed from the processing chamber 190 after proper post processing steps as known to a person skilled in the art.

Accordingly, as described above in various embodiments, oxynitride dielectric films are deposited by generating amino ($NH_2$*) and oxygen (O*) radicals from a gas mixture comprising oxygen, hydrogen, and ammonia or ozone and ammonia. The radicals being very reactive, not only react with dielectric atoms to form oxynitride dielectric 112 but also react with halogen or carbon atoms to form volatile compounds that are not incorporated into the growing dielectric material. This is because the volatile compounds are pumped away removing them from the oxynitride dielectric film being deposited. On the other hand, in the absence of the highly reactive amino and oxygen radicals, at least some of the halogen or carbon from the dielectric procure may be incorporated into the growing dielectric material. Accordingly, embodiments of the present invention are able to produce dielectric films with higher purity and improved electrical properties.

Figure 14:
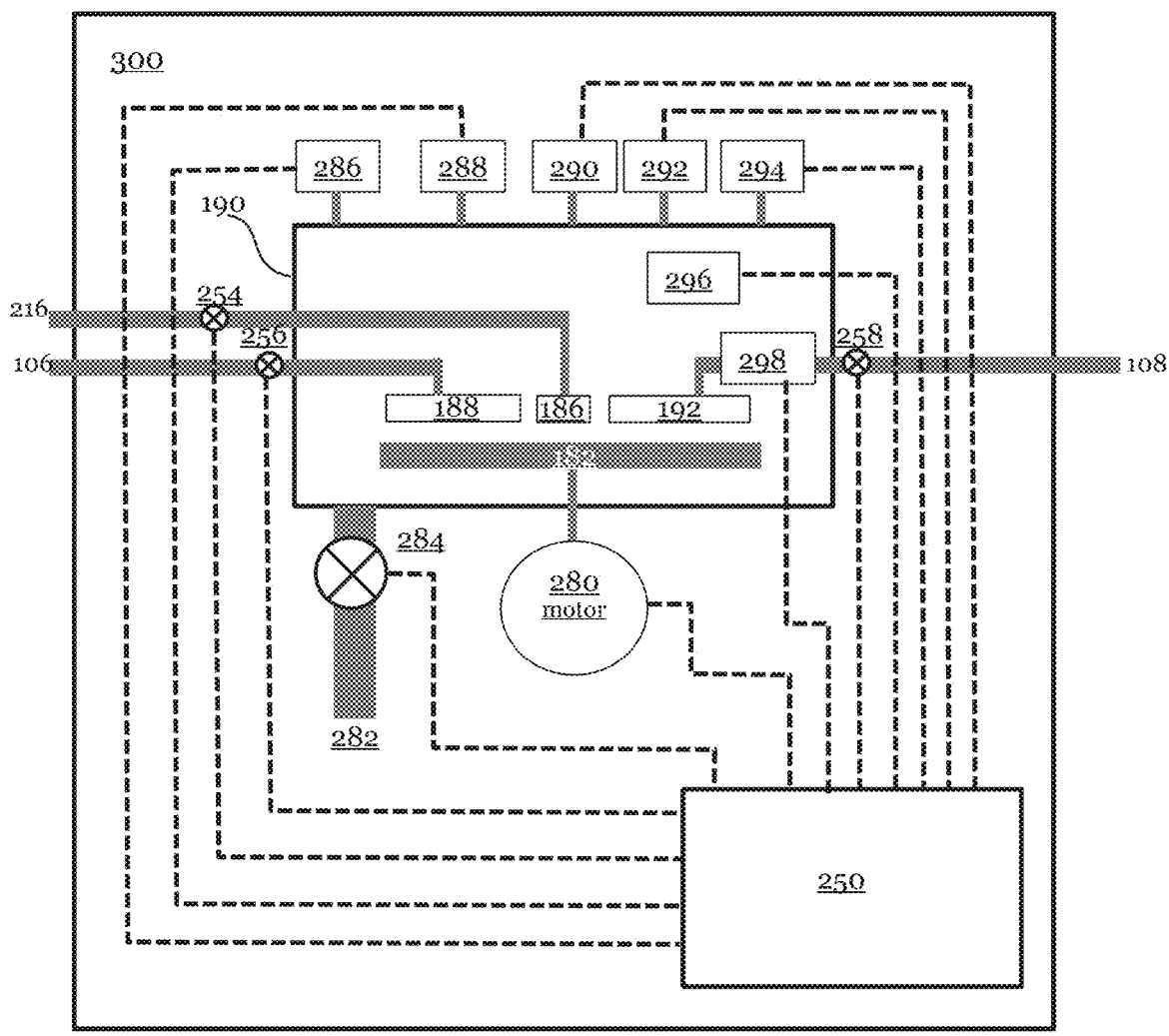
FIG. 14 is a block diagram of an atomic layer deposition (ALD) system in accordance with an embodiment.

FIG. 14 is a block diagram describing the components in an atomic layer deposition (ALD) tool 300. A top down view of the processing chamber 190 in the ALD tool 300 is illustrated in FIG. 12.

As previously described, wafers on a substrate table 182 rotate under the dielectric precursor gas showerhead 188, the mixture gas showerhead 192, and the wedge-shaped inert gas showerheads 186. The flow of dielectric precursor gases 106 and mixture gas 108 through gas lines are controlled by mass flow controllers 256 and 258. The flow of the inert gas 216 is controlled by mass flow controller 254. The gases are evacuated from the processing chamber 190 through vacuum line 282 and vacuum valve 284.

A microcontroller or multiple microcontrollers coupled together monitor the ALD process and control the operation of the ALD tool 300 throughout the ALD process. Machine components such as the heaters and temperature controllers 296, 298 within the deposition chamber 190 as well as the mass flow controllers 254, 256, 258, the vacuum valve 284, the substrate table motor 280 and other components external to the processing chamber 190 are all coupled to and controlled by the controller 250.

Various equipment sensors measure equipment parameters such as table motor's 280 speed and temperature, substrate table rpm, heater currents, vacuum pump speed and temperature, and provide signals to ensure the equipment is operating properly. Various process sensors measure process parameters such as process temperature, process pressure, plasma density, gas flow rates, gas composition, and provide signals to ensure the process is operating properly. The data from the process sensors and the equipment sensors provide feedback data to the controller 250 continuously throughout the ALD process. The controller 250 can make adjustments in real time to keep the equipment and process close to center of specifications.

Additional wafer sensors 286, 288, 290, 292, 294 coupled to the controller 250 can be added to monitor the film as it is being deposited (or etched) to provide composition and thickness data in real time. This feed back data can be used by the controller 250 to continuously adjust the process as the ALD film is being deposited (or etched) and to turn the process off when the target thickness end point is reached.

Wafer sensor data can be taken at multiple points across the wafer to measure process uniformity and to measure the thickness and composition of the film across the wafer in-situ and in real time. For example, multiple across wafer sensors in a multi-wafer ALD tool such as shown in FIG. 12 can be used to monitor and tune film thickness and composition uniformity from the top of the wafer to the bottom of the wafer. Multiple across wafer sensors in a single wafer ALD tool such as shown in FIG. 7 can be used to monitor and tune film thickness and composition uniformity from the center of the wafer to the edge of the wafer. Example wafer sensors include ellipsiometric sensors, multiwavelength ellipsiometric sensors, particle sensors, plasma density sensors, reflectometer sensors, spectrometric sensors, residual gas analyzers, etc.

In the ALD tool 300 shown in FIG. 14, sensors and controller 250 are provided for monitoring various parameters and automatically adjusting one or more variables and/or process conditions of the system or process described herein to achieve a film composition and a deposited film uniformity. Examples of parameters adjusted include a ratio of oxygen to hydrogen in the gas mixture, a flow rate of oxygen, hydrogen, and/or ammonia, e.g., to change a mole fraction of ammonia.

Sensors may be coupled to and/or located within processing chamber 190 for monitoring various parameters of the substrate, the ALD tool 300 and/or the ALD process described herein. Sensors may include various types of sensors including, but not limited to, optical sensors (such as cameras, lasers, light, reflectometer, spectrometers, ellipsometric, etc.), capacitive sensors, ultrasonic sensors, gas sensors, or other sensors that may monitor a condition of the substrate, and/or the ALD tool 300. In one example embodiment, one or more optical sensors may be used to measure the thickness and refractive index of the depositing dielectric in real time. In another example embodiment, a spectrometer may be used to measure a film thickness of one or more layers provided on the patterned substrate. In yet another embodiment, a residual gas analyzer (RGA) may be used to detect precursor breakdown for real-time chemical reaction completion detection.

Controller 250 is coupled for receiving data from sensor(s) and configured for controlling one or more process parameters of the processing chamber 190 based on the sensor data. In some embodiments, controller 250 may be configured to analyze the data collected by the sensor(s) and provide feedback to control various process parameters of components of processing chamber 190. In some embodiments, controller 250 may use or analyze the sensor data to determine when to end one or more steps of the ALD process described herein. For example, controller 250 may receive data from a residual gas analyzer to detect an endpoint of the layer modification step. In another example, controller 250 may utilize spectroscopic ellipsometry to detect an average film thickness of the film being ALD deposited on the substrate during rotation and provide an indication of film thickness change during the ALD process. In another example, controller 250 may utilize spectroscopic ellipsometry to detect the refractive index of the film being ALD deposited on the substrate during rotation and provide an indication of film composition change during the ALD process. In some embodiments, controller 250 may automatically end the ALD process when a thickness objective is achieved. In some embodiments, controller 250 may automatically adjust one or more parameters such as a ratio of oxygen to hydrogen in the mixture and/or a mole fraction of ammonia during the ALD deposition process to achieve the across wafer thickness and composition uniformity. The sensor data and the controller 250 may also be utilized to achieve a desired substrate throughput objective. Further, the sensor data and the controller 250 may be utilized to achieve a desired thickness and composition along with a desired substrate throughput or alternatively target a combination.

The controller 250 described herein can be implemented in a wide variety of manners. In one example, the controller 250 may be a computer. In another example, the controller 250 may include one or more programmable integrated circuits that are programmed to provide the functionality described herein. For example, one or more processors (e.g., microprocessor, microcontroller, central processing unit, etc.), programmable logic devices (e.g., complex programmable logic device (CPLD)), field programmable gate array (FPGA), etc.), and/or other programmable integrated circuits can be programmed with software or other programming instructions to implement the functionality described herein for controller 250. In various embodiments, the software or other programming instructions can be stored in one or more non-transitory computer-readable mediums (e.g., memory storage devices, flash memory, dynamic random access memory (DRAM), reprogrammable storage devices, hard drives, floppy disks, DVDs, CD-ROMs, etc.), and the software or other programming instructions when executed by the programmable integrated circuits cause the programmable integrated circuits to perform the processes, functions, and/or capabilities described herein. Other variations could also be implemented.

Embodiments may be implemented in different ways as described in some such examples below.

Example 1. A method for depositing a dielectric material, the method including: heating a substrate disposed in a dielectric deposition chamber; dispensing a dielectric precursor from a first showerhead towards a major outer surface of the substrate; dispensing a mixture containing oxygen and ammonia from a second showerhead towards the major outer surface of the substrate; and reacting the dielectric precursor with the mixture to deposit a layer of oxynitride dielectric material on the substrate.

Example 2. The method of example 1, further including: measuring a metric of the layer of oxynitride dielectric material; determining that the metric is not within a target process window for the metric; changing a ratio of oxygen to hydrogen in the mixture and adjusting a mole fraction of ammonia in the mixture; and repeating the heating and the reacting to deposit another layer of oxynitride on another substrate disposed in the dielectric deposition chamber.

Example 3. The method of one of examples 1 or 2, where the metric is index of refraction, dielectric constant, dielectric leakage current, breakdown voltage, or pin hole density.

Example 4. The method of one of examples 1 to 3, where measuring the metric including determining a purity of the layer of oxynitride dielectric material using Fourier-transform infrared spectroscopy (FTIR), mass spectroscopy, x-ray diffraction, or energy dispersive x-ray spectroscopy (EDS). 2. The method of one of examples 1 to 3, where the dielectric precursor is a chlorosilane and the dielectric material is silicon oxynitride.

Example 5. The method of one of examples 1 to 4, where the dielectric precursor is a hafnium chloride and the oxynitride dielectric is hafnium oxynitride.

Example 6. The method of one of examples 1 to 5, where dispensing the dielectric precursor includes depositing dielectric atoms on the substrate, where the reacting includes thermally reacting the mixture near the major outer surface producing NH2* radicals and O* radicals and reacting the NH2* radicals and O* radicals with the dielectric atoms to deposit the layer of oxynitride dielectric material.

Example 7. The method of one of examples 1 to 6, where the mixture includes hydrogen and where the reacting includes thermally reacting the mixture near the major outer surface generating NH2* radicals by oxidizing ammonia with oxygen radicals formed during a thermal reaction of oxygen with hydrogen.

Example 8. The method of one of examples 1 to 7, further including adjusting a ratio of oxygen to hydrogen in the mixture to between about 0.5 to 2.0 and adjusting a mole fraction of ammonia to between about 20% to 50% and thereby tuning a stoichiometry of nitrogen and oxygen in the layer of oxynitride dielectric material.

Example 9. The method of one of examples 1 to 8, where a ratio of oxygen to hydrogen is about 1.5 and where a mole fraction of ammonia is about 30% in the mixture.

Example 10. The method of one of examples 1 to 9, where the mixture includes ozone and ammonia and where NH2* radicals are generated by reacting oxygen radicals generated by thermal decomposition of the ozone with the ammonia; or where the mixture includes ammonia plus O* radicals generated in a remote plasma and where NH2* radicals are generated by a low pressure radical oxidation of ammonia by O* radicals.

Example 11. The method of one of examples 1 to 10, where the first showerhead is a first chamber in a dual showerhead and where the second showerhead is a second chamber in the dual showerhead.

Example 12. The method of one of examples 1 to 11, further including rotating the substrate under the first showerhead while dispensing the dielectric precursor and rotating the substrate under the second showerhead while dispensing the mixture.

Example 13. The method of one of examples 1 to 12, where heating a substrate includes heating the substrate to a temperature between about 600° C. and about 1100° C., where dispensing the mixture includes maintaining a flow rate of the mixture to between about 5 and 15 slm, and where a pressure in the dielectric deposition chamber is between about 1 Torr and about 10 Torr.

Example 14. A method for depositing silicon oxynitride, the method including: heating a substrate disposed on a substrate holder in a dielectric deposition chamber; rotating the substrate holder under a first showerhead; dispensing a silicon precursor from the first showerhead towards a major outer surface of the substrate; rotating the substrate holder under a second showerhead; dispensing a mixture of hydrogen, oxygen, and ammonia from the second showerhead towards the major outer surface; and depositing the silicon oxynitride over the substrate by reacting the silicon precursor with the mixture.

Example 15. The method of example 14, further including adjusting a ratio of oxygen to hydrogen in the mixture to between about 0.5 to 2.0 and adjusting a mole fraction of ammonia in the mixture to between about 20% to 50% to tune a stoichiometry of nitrogen and oxygen in the silicon oxynitride.

Example 16. The method of one of examples 14 or 15, where heating the substrate includes heating the substrate to a temperature between about 600° C. and about 1100° C., where a flow rate of the mixture is between about 5 and 15 slm, and where a pressure in the dielectric deposition chamber is between about 1 Torr and about 10 Torr.

Example 17. The method of one of examples 14 to 16, where the silicon precursor is a chlorosilane.

Example 18. The method of one of examples 14 to 17, where dispensing the silicon precursor deposits a layer of silicon on the substrate, where dispensing the mixture generates NH2* and O* radicals proximal to the layer of silicon, and the NH2* and O* radicals react with the layer of silicon to deposit the silicon oxynitride.

Example 19. A method for depositing a dielectric material, the method including: loading a substrate on a substrate holder disposed within a processing chamber; heating the substrate within the processing chamber; dispensing a dielectric precursor from a first showerhead in a first zone over the substrate holder; dispensing a mixture of hydrogen, oxygen, and ammonia from a second showerhead in a second zone over the substrate holder; moving the substrate holder to repeatedly transfer the substrate between the first zone and the second zone; dispensing silicon precursor from the first showerhead towards a major surface of the substrate in the first zone; dispensing the mixture from the second showerhead towards the major surface of the substrate from the second showerhead; and depositing the dielectric material on the substrate by reacting the silicon precursor with the mixture.

Example 20. The method of example 19, where the dielectric precursor is a chlorosilane and the dielectric material is silicon oxynitride.

Example 21. The method of one of examples 19 or 20, further including adjusting a ratio of oxygen to hydrogen in the mixture to between about 0.5 to 2.0 and adjusting a mole fraction of ammonia in the mixture to between about 20% to 50% to tune a stoichiometry of nitrogen and oxygen in the dielectric material.

Example 22. The method of one of examples 19 to 21, where heating the substrate includes heating the substrate to a temperature between about 600° C. and about 1100° C., where a flow rate of the mixture is between about 5 and 15 slm, and where a pressure in the processing chamber is between about 5 Torr and about 10 Torr.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments

What is claimed is:

1. A method for depositing a dielectric material, the method comprising:
heating a substrate disposed in a dielectric deposition chamber;
dispensing a dielectric precursor from a first showerhead towards all of a major outer surface of the substrate;
dispensing a mixture containing oxygen and ammonia from a second showerhead towards all of the major outer surface of the substrate; and
reacting the dielectric precursor with the mixture to deposit a layer of oxynitride dielectric material on the substrate.

2. The method of claim 1, further comprising:
measuring a metric of the layer of oxynitride dielectric material;
determining that the metric is not within a target process window for the metric;
changing a ratio of oxygen to hydrogen in the mixture by adjusting a mole fraction of ammonia in the mixture; and
repeating the heating and the reacting to deposit another layer of oxynitride dielectric material on another substrate disposed in the dielectric deposition chamber, a metric of the another layer of oxynitride dielectric material being different from the metric of the layer of oxynitride dielectric material.

3. The method of claim 2, wherein the metric is index of refraction, dielectric constant, dielectric leakage current, breakdown voltage, or pin hole density.

4. The method of claim 2, wherein measuring the metric comprises determining a purity of the layer of oxynitride dielectric material using Fourier-transform infrared spectroscopy (FTIR), mass spectroscopy, x-ray diffraction, or energy dispersive x-ray spectroscopy (EDS).

5. The method of claim 1, wherein the dielectric precursor is a chlorosilane and the dielectric material is silicon oxynitride, or wherein the dielectric precursor is a hafnium chloride and the oxynitride dielectric material is hafnium oxynitride.

6. The method of claim 1, wherein dispensing the dielectric precursor comprises depositing dielectric atoms on the substrate, wherein the reacting comprises thermally reacting the mixture near the major outer surface producing NH2* radicals and O* radicals and reacting the NH2* radicals and O* radicals with the dielectric atoms to deposit the layer of oxynitride dielectric material.

7. The method of claim 1, wherein the mixture comprises hydrogen (H2) and wherein the reacting comprises thermally reacting the mixture near the major outer surface generating NH2* radicals by oxidizing ammonia with oxygen radicals formed during a thermal reaction of oxygen with hydrogen.

8. The method of claim 7, further comprising adjusting a ratio of oxygen to hydrogen in the mixture to between about 0.5 to 2.0 and adjusting a mole fraction of ammonia to between about 20% to 50% and thereby tuning a stoichiometry of nitrogen and oxygen in the layer of oxynitride dielectric material.

9. The method of claim 7, wherein a ratio of oxygen to hydrogen is about 1.5 and wherein a mole fraction of ammonia is about 30% in the mixture.

10. The method of claim 1, wherein the mixture comprises ozone and ammonia and wherein NH2* radicals are generated by reacting oxygen radicals generated by thermal decomposition of the ozone with the ammonia; or wherein the mixture comprises ammonia plus O* radicals generated in a remote plasma and wherein NH2* radicals are generated by a low pressure radical oxidation of ammonia by O* radicals.

11. The method of claim 1, wherein the first showerhead is a first chamber in a dual showerhead and wherein the second showerhead is a second chamber in the dual showerhead.

12. The method of claim 1, further comprising rotating the substrate to be under the first showerhead while dispensing the dielectric precursor and rotating the substrate to be under the second showerhead while dispensing the mixture.

13. The method of claim 1, wherein heating a substrate comprises heating the substrate to a temperature between about 600° C. and about 1100° C., wherein dispensing the mixture comprises maintaining a flow rate of the mixture to between about 5 and 15 slm, and wherein a pressure in the dielectric deposition chamber is between about 1 Torr and about 10 Torr.

14. The method of claim 1, wherein the dielectric precursor and the mixture containing oxygen and ammonia are delivered to all of the major outer surface of the substrate.

15. A method for depositing silicon oxynitride, the method comprising:
   heating a substrate disposed on a substrate holder in a dielectric deposition chamber; and
   forming the silicon oxynitride over the substrate by reacting a silicon precursor with a mixture, the forming comprising:
      rotating the substrate holder to be under a first showerhead;
      while the substrate holder is being held under the first showerhead, dispensing the silicon precursor from the first showerhead towards a major outer surface of the substrate;
      rotating the substrate holder to be under a second showerhead; and
      while the substrate holder is being held under the second showerhead, dispensing the mixture of hydrogen (H2), oxygen, and ammonia from the second showerhead towards the major outer surface.

16. The method of claim 15, further comprising adjusting a ratio of oxygen to hydrogen in the mixture to between about 0.5 to 2.0 and adjusting a mole fraction of ammonia in the mixture to between about 20% to 50% to tune a stoichiometry of nitrogen and oxygen in the silicon oxynitride.

17. The method of claim 15, wherein heating the substrate comprises heating the substrate to a temperature between about 600° C. and about 1100° C., wherein a flow rate of the mixture is between about 5 and 15 slm, and wherein a pressure in the dielectric deposition chamber is between about 1 Torr and about 10 Torr.

18. The method of claim 15, wherein dispensing the silicon precursor deposits a layer of silicon on the substrate, wherein dispensing the mixture generates NH2* and O* radicals proximal to the layer of silicon, and the NH2* and O* radicals react with the layer of silicon to deposit the silicon oxynitride.

19. A method for depositing a dielectric material, the method comprising:
   loading a substrate on a substrate holder disposed within a processing chamber; and
   forming a dielectric material on the substrate by reacting a silicon precursor with a mixture, the forming comprising:
      heating the substrate within the processing chamber;
      dispensing the dielectric precursor from a first showerhead in a first zone over the substrate holder;
      dispensing the mixture of hydrogen (H2), oxygen, and ammonia from a second showerhead in a second zone over the substrate holder;
      moving the substrate holder to repeatedly transfer the substrate between the first zone and the second zone;
      dispensing silicon precursor from the first showerhead towards a major surface of the substrate in the first zone; and
      dispensing the mixture from the second showerhead towards the major surface of the substrate from the second showerhead.

20. The method of claim 19, wherein the dielectric precursor is a chlorosilane and the dielectric material is silicon oxynitride.

21. The method of claim 19, further comprising adjusting a ratio of oxygen to hydrogen in the mixture to between about 0.5 to 2.0 and adjusting a mole fraction of ammonia in the mixture to between about 20% to 50% to tune a stoichiometry of nitrogen and oxygen in the dielectric material.

22. The method of claim 19, wherein heating the substrate comprises heating the substrate to a temperature between about 600° C. and about 1100° C., wherein a flow rate of the mixture is between about 5 and 15 slm, and wherein a pressure in the processing chamber is between about 5 Torr and about 10 Torr.

* * * * *